United States Patent
Yokouchi et al.

(10) Patent No.: US 7,881,359 B2
(45) Date of Patent: Feb. 1, 2011

(54) SURFACE-EMISSION SEMICONDUCTOR LASER DEVICE

(75) Inventors: Noriyuki Yokouchi, Tokyo (JP); Norihiro Iwai, Tokyo (JP)

(73) Assignee: The Furukawa Electric Co., Ltd, Tokyo (JP)

( * ) Notice: Subject to any disclaimer, the term of this patent is extended or adjusted under 35 U.S.C. 154(b) by 0 days.

(21) Appl. No.: 12/103,142

(22) Filed: Apr. 15, 2008

(65) Prior Publication Data

US 2008/0254566 A1    Oct. 16, 2008

Related U.S. Application Data

(63) Continuation-in-part of application No. 11/392,493, filed on Mar. 30, 2006, now Pat. No. 7,368,316, which is a continuation-in-part of application No. 11/109,667, filed on Apr. 20, 2005, now abandoned, which is a continuation of application No. 10/246,553, filed on Sep. 19, 2002, now abandoned, which is a continuation of application No. 09/546,691, filed on Apr. 10, 2000, now abandoned.

(30) Foreign Application Priority Data

Apr. 23, 1999    (JP) .................................. 11-115964

(51) Int. Cl.
*H01S 3/097* (2006.01)
*H01S 5/00* (2006.01)
(52) U.S. Cl. ..................... 372/87; 372/44.01
(58) Field of Classification Search .................. None
See application file for complete search history.

(56) References Cited

U.S. PATENT DOCUMENTS 3,386,867 A    6/1968    Staples
(Continued)

FOREIGN PATENT DOCUMENTS

JP    5-231446    9/1993

OTHER PUBLICATIONS

Vishnyakov, et al., Production of Ohmic Contacts to AlGaAs of the n- and p-type Conductivity with Surface Cleaning in Atomic Hydrogen, SPIE Conference on Microelectronic Devices, Santa Clara, Sep. 1998, pp. 335-340.

(Continued)

*Primary Examiner*—Minsun Harvey
*Assistant Examiner*—Sean Hagan
(74) *Attorney, Agent, or Firm*—Oblon, Spivak, McClelland, Maier & Neustadt, L.L.P.

(57) ABSTRACT

A surface-emitting semiconductor laser device includes a semi-insulating substrate, a layer structure with a bottom multilayer reflector, an n-type cladding layer, an active layer structure for emitting laser, a p-type cladding layer and a top multilayer reflector with a dielectric material, consecutively formed on the semi-insulating substrate, the active layer structure, the p-type cladding layer and the top multilayer reflector, configuring a mesa post formed on a portion of the n-type cladding layer, the p-type cladding layer or the p-type multilayer reflector. The surface-emitting semiconductor laser includes a p-side electrode formed on another portion of the p-type cladding layer, and an n-side electrode formed on another portion of the n-type cladding layer. The n-side electrode includes a substantially uniform Au film and AuGeNi film or AuGe film consecutively formed on the n-type cladding layer, and an alloy is formed between said Au film and said AuGeNi film or AuGe film.

4 Claims, 8 Drawing Sheets

U.S. PATENT DOCUMENTS

| | | | |
|---|---|---|---|
| 3,959,522 A | | 5/1976 | Ladany et al. |
| 4,179,534 A | | 12/1979 | Chang et al. |
| 4,488,306 A | * | 12/1984 | Sugino et al. ............ 372/46.01 |
| 4,766,472 A | | 8/1988 | Brillouet et al. |
| 4,853,346 A | | 8/1989 | Baker et al. |
| 5,196,369 A | | 3/1993 | Hayakawa |
| 5,493,577 A | * | 2/1996 | Choquette et al. ...... 372/46.013 |
| 5,719,891 A | * | 2/1998 | Jewell ................... 372/46.013 |
| 5,731,224 A | | 3/1998 | Gerner |
| 5,896,408 A | | 4/1999 | Corzine et al. |
| 5,959,401 A | | 9/1999 | Asami et al. |
| 6,014,400 A | | 1/2000 | Kobayashi et al. |
| 6,046,065 A | * | 4/2000 | Goldstein et al. ........ 372/50.11 |
| 6,061,380 A | | 5/2000 | Jiang et al. |
| 6,061,485 A | | 5/2000 | Jiang et al. |
| 6,316,792 B1 | | 11/2001 | Okazaki et al. |
| 6,420,736 B1 | | 7/2002 | Chen et al. |
| 6,480,516 B1 | | 11/2002 | Shimizu |
| 6,829,274 B2 | | 12/2004 | Ueda et al. |
| 6,839,369 B2 | | 1/2005 | Iwai et al. |
| 6,900,475 B2 | | 5/2005 | Yokouchi et al. |

OTHER PUBLICATIONS

Yih-Chen Shih, et al., Effects of Interfacial Microstructure on Uniformity and Thermal Stability of AuNiGe Ohmic Contact to n-type GaAs, J. Appl. Phys. 62 (2), Jul. 15, 1987, 1987 American Institute of Physics, pp. 582-590.

T.S. Kuan, et al., Electron Microscope Studies in an Alloyed Au/Ni/Au-Ge Ohmic Contact to GaAs, J. Appl. Phys. 54 (12), Dec. 1983, 1983 American Institute of Physics, pp. 6952-6957.

T.K. Higman, et al., Structural Analysis of Au-Ni-Ge and Au-Ag-Ge Alloyed Ohmic Contacts on Modulation-doped AIGaAs-GaAs Heterostructures, J. Appl. Phys. 60 (2), Jul. 15, 1986, 1986 American Institute of Physics, pp. 677-680.

K. Matsuda, et al., A Surface-Emitting Laser Array with Backside Guiding Holes for Passive Alignment to Parallel Optical Fibers, IEEE Photonics Technology Letters, vol. 8, No. 4, Apr. 1996, pp. 494-496.

U.S. Appl. No. 12/108,931, filed Apr. 24, 2008, Iwai, et al.

* cited by examiner

SURFACE-EMISSION SEMICONDUCTOR LASER DEVICE

The present application is a continuation-in-part of application Ser. No. 11/392,493, filed Mar. 30, 2006, which is a continuation-in-part of application Ser. No. 11/109,667, filed Apr. 20, 2005, which is a continuation of application Ser. No. 10/246,553, filed Sep. 19, 2002, which is a continuation of application Ser. No. 09/546,691, filed Apr. 10, 2000. The entire contents of the above applications are incorporated herein by reference.

BACKGROUND OF THE INVENTION

1. Field of the Invention

The present invention relates to a method for fabricating a surface-emission semiconductor laser device and, more particularly, to a method for fabricating a surface-emission semiconductor laser device which has an improved characteristic of injected current/applied voltage and thus is suited for use in an optical data transmission or optical communication.

2. Description of the Related Art

Surface-emission semiconductor laser devices, particularly those implemented on GaAs substrates, attract a large attention as light sources for use in optical communication systems in the field of data communication. The surface-emission semiconductor laser device fabricated on a GaAs substrate generally includes a pair of multi-layered semiconductor mirrors, or distributed Bragg reflectors (DBRs), each formed of a plurality of pairs of AlGaAs layers each having a mixed crystal structure, and a GaAs active layer structure sandwiched between the pair of DBRs for emission of laser perpendicular to the main surface of the GaAs substrate.

The surface-emission semiconductor laser device, which emits laser perpendicular to the main surface of a substrate, has an advantage of integration feasibility wherein a large number of laser elements are arranged two-dimensionally on the single substrate. Accordingly, the surface-emission semiconductor laser devices are particularly suitable for applications to parallel optical information processing, such as optical interconnection and optical computing, or a large-scale parallel optical transmission by taking advantage of the parallel optical beams.

The surface-emission semiconductor laser device implemented on an n-type GaAs substrate includes a p-type DBR, which has a larger resistivity compared to the n-type DBR due to the inherent characteristic thereof and a smaller occupied area compared to the n-type DBR due to the device structure. This raises a problem of higher electric resistance of the p-type DBR, which causes a smaller injected current with respect to a voltage applied between the electrodes.

FIG. 6 shows the surface-emission semiconductor laser device described in the above-mentioned publication. The semiconductor laser device 50 includes a p-type GaAs substrate 52, a p-type DBR 54 composed of GaAs/AlAs layers formed on the entire surface of the p-type substrate 52, a column structure formed thereon and including an active layer structure 56, an n-type DBR 58 composed of GaAs/AlAs layers and an n-side electrode 60, and a p-side electrode 62 formed on the p-type DBR 54 separately from the column structure. The laser device 50 emits laser perpendicularly to and through the bottom surface of the substrate 52, as shown in FIG. 6.

In a laser device formed on a p-type substrate, in general, an n-type compound semiconductor layer constitutes the top of the epitaxial layers. In the example of FIG. 6, the top epitaxial layer is the n-type GaAs layer or the AlAs layer implementing the n-type DBR 58.

Since the surface-emission semiconductor laser device generally includes epitaxial layers having complicated structures formed on a small area of the main surface of the substrate, the contact area between the n-type compound semiconductor layer and the n-side electrode is inherently small. This highlights the importance in reduction of the contact resistance between the n-type compound semiconductor layer and the n-side electrode in the surface-emission semiconductor laser device. In a conventional surface-emission semiconductor laser having the p-type substrate, however, the reduction of the contact resistance is not satisfactory, and thus the operational voltage of the surface-emission semiconductor laser device is higher than the desired voltage.

SUMMARY OF THE INVENTION

In view of the above, it is an object of the present invention to provide a method for fabricating a surface-emission semiconductor laser device on a p-type substrate, the surface-emission semiconductor laser device having a smaller contact resistance between the n-type compound semiconductor layer and the n-side electrode.

The present invention provides a method for fabricating a surface-emission semiconductor laser device, including the steps of forming consecutively a p-type distributed Bragg reflector (DBR), an active layer structure for emitting laser, and an n-type DBR which overlie a main surface of a p-type semiconductor substrate, forming an n-side electrode overlying the n-type DBR, and forming a p-side electrode on a bottom surface of the p-type semiconductor substrate, the n-side electrode forming step including the steps of forming an Au film, forming an AuGeNi film or AuGe film on the Au film, and forming an alloy between the Au film and the AuGeNi film or AuGe film.

In accordance with the method of the present invention, the presence of the Au film improves the adherence between the compound semiconductor layer and the n-side electrode, which in turn improves an injection current vs. applied voltage characteristic.

The above and other objects, features and advantages of the present invention will be more apparent from the following description, referring to the accompanying drawings.

DESCRIPTION OF THE EMBODIMENTS

In a typical surface-emission semiconductor laser device of the prior art having a p-type substrate, the n-side electrode is generally made of AuGe or AuGeNi formed on the n-type compound semiconductor layers epitaxially grown on the p-type substrate (refer to, for example, K. Matusda, et al., IEEE Photonics Technol. Lett., vol. 8, pp. 494, 1996).

The inventors noticed the excellent adherence between a compound semiconductor layer and an Au film, and had an idea of interposing an Au film between the n-type compound semiconductor layers and the n-side electrode made of AuGe (Ni) for reduction of the contact resistance therebetween. The inventors fabricated a number of samples of surface-emission semiconductor lasers on p-type GaAs substrates, the semiconductor lasers having a variety of n-side electrodes made of metallic or alloy films. The inventors then conducted experiments thereto by measuring injected current vs. applied voltage characteristics.

Experiments

Figure 7A:
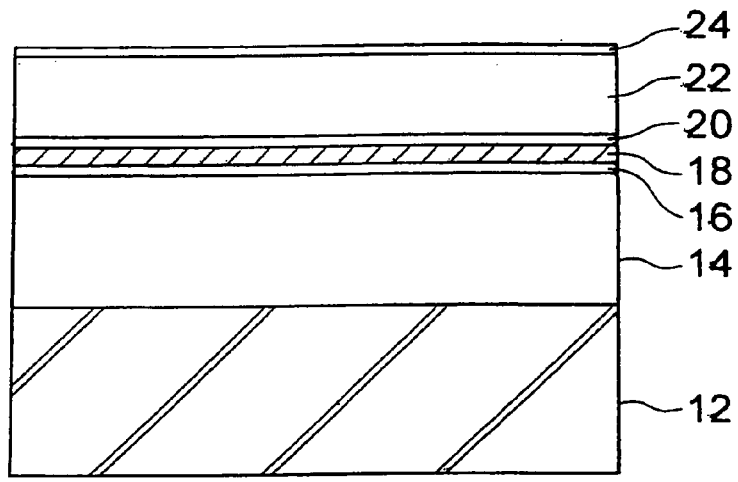
FIGS. 7A to 7D are sectional views of a surface-emission semiconductor laser device in consecutive steps of fabrication thereof in a method according to an embodiment of the present invention.

The samples were fabricated by using the method shown in FIGS. 7A to 7D. In FIG. 7A, 28 combinations of a p-type $Al_{0.2}Ga_{0.8}As$ layer and a p-type $Al_{0.9}Ga_{0.1}As$ layer and an additional p-type $Al_{0.9}Ga_{0.1}As$ layer were epitaxially grown on a p-type GaAs substrate 12 by using a MOCVD (metal-organic chemical vapor deposition) technique to form a p-type DBR 14.

Subsequently, an undoped lower $Al_{0.3}Ga_{0.7}As$ cladding layer 16, an active layer structure 18 implemented as a GaAs/$Al_{0.2}Ga_{0.8}As$ multiple quantum well (MQW) structure including three 7-nm-thick GaAs quantum well active layers, and an undoped upper $Al_{0.3}Ga_{0.7}As$ cladding layer 20 were consecutively grown on the p-type DBR 14.

Thereafter, 25 combinations of an n-type $Al_{0.2}Ga_{0.8}As$ layer and an $Al_{0.9}Ga_{0.1}As$ layer were grown on the upper cladding layer 20 to form an n-type DBR 22, followed by epitaxial growth of an n-type cap layer 24 on the top $Al_{0.2}Ga_{0.8}As$ layer of the n-type DBR 22, thereby obtaining the structure shown in FIG. 7A.

A SiNx film 26 was then deposited on the entire area by using a plasma enhanced CVD technique, followed by formation of a photoresist film 28 on the SiNx film 26 and patterning thereof by using an ordinary photolithographic technique to form an etching mask 28. The etching mask 28 had an annular opening which encircles a central circular pattern 30 having a diameter of 30 μm.

Figure 7B:
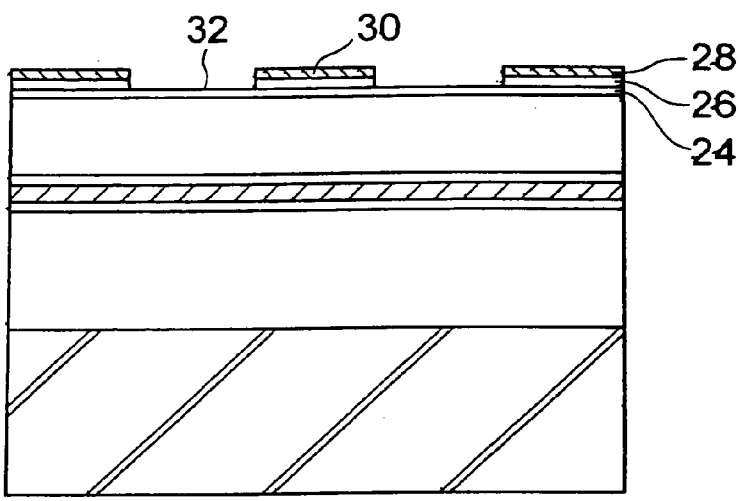
Figure 7C:
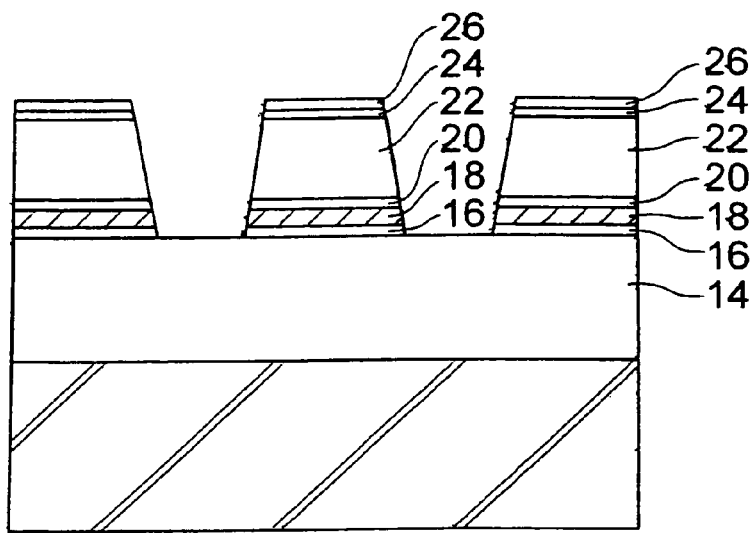

The SiNx film 26 was then subjected to a reactive ion etching (RIE) technique by using $CF_4$ gas and the etching mask 28 to form an opening 32 in the SiNx film 26. The resultant structure is shown in FIG. 7B.

The etching mask 28 was then removed, followed by wet etching of the n-type cap layer 24, n-type DBR 22, upper cladding layer 20, active layer structure 18 and lower cladding layer 16 by using the SiNx film 26 as an etching mask and an etchant including a mixture of phosphoric acid, hydrogen peroxide and water. Thus, an annular portion of the p-type DBR 14 was exposed, and a column structure including the n-type cap layer 24, n-type DBR 22, upper cladding layer 20, active layer structure 18 and lower cladding layer 16 was formed on the central area of the p-type DBR 14.

After removing the SiNx mask 26 by using a RIE technique, another SiNx film 34 was deposited on the entire area. Then, a portion of the top of the another SiNx film 34 covering the column structure was removed by using a photolithographic technique and a RIE technique to form an emission window 36 having a diameter of 10 μm. Subsequently, an n-side electrode 38 was formed by using an electron beam evaporation and a patterning technique to have an emission opening therein corresponding to the emission window 36. The n-side electrode 38 was made of a plurality of metallic films and had an annular area for current injection.

After the bottom of the GaAs substrate 12 was polished to obtain a thickness of 100 μm for the GaAs substrate 12, a p-side electrode 40 made of AuZn film was formed by evaporation onto the polished bottom surface of the GaAs substrate 12. A surface-emission semiconductor laser device 10 was thus achieved after an alloying treatment of the n-side electrode 38 and the p-side electrode 40.

Figure 7D:
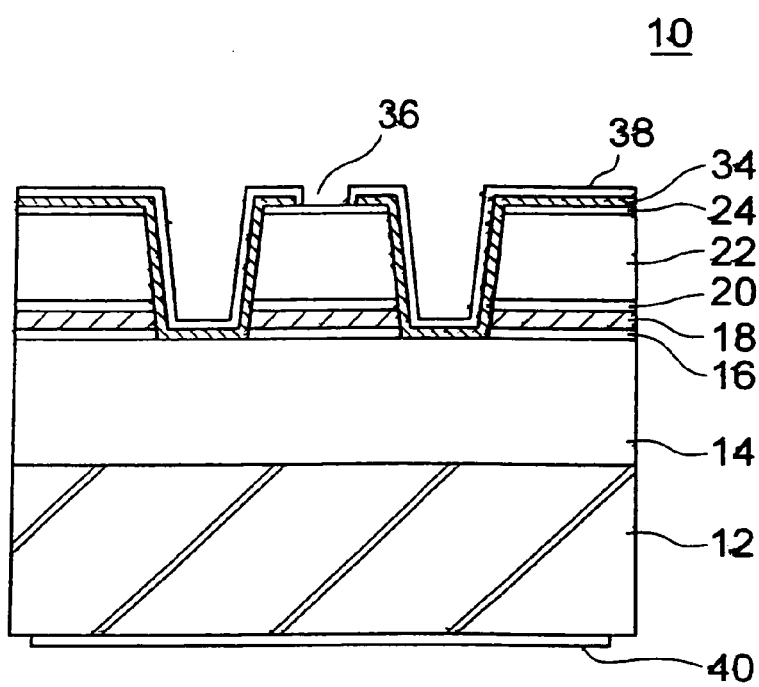

A plurality of samples for the surface-emission semiconductor laser device 10 of FIG. 7D were fabricated which included different structures of the n-side electrode. The samples had n-side electrodes including at least one of three films of metals or alloys, as shown in Table 1. In the table, each column shows the material for the corresponding film and the thickness (nm) thereof in parentheses.

1 TABLE 1 Sample No. First film Second film Third film Sample #1 Au (30) AuGeNi (50) Au (200) Sample #2 Au (30) AuGe (50) Au (200) Sample #3 Au (250) Sample #4 AuGeNi (50) Au (200) Sample #5 Ti (100) Pt (200) Au (200)

The AuGeNi film in Samples #1 and #4 included Ni at a ratio below 1%, Ge at about 12%, and the balance of Au at about 88%. The AuGe film in Sample #2 included Au at about 88% and the balance of Ge at about 12%.

The adherence between the metallic films and the compound semiconductor layer in each of Samples #1 to #5 was inspected at the surface of the n-side electrode after annealing the samples for three minutes at a temperature of 420.degree. C. in a nitrogen ambient. Samples #1 to #3 exhibited an alloy structure of the n-side electrode, Samples #4 exhibited unevenness or irregularity at the surface of the n-side electrode, and Samples #5 did not exhibit an alloy structure, without a substantial change of the color or shape of the n-side electrode after the annealing.

More specifically, it is judged that Samples #1 and #2, wherein an Au film was interposed between the AuGeNi or AuGe film and the compound semiconductor layer, had a higher adherence between the electrode and the semiconductor layer. It is also judged that Sample #3, wherein the electrode was formed by a single Au film, had a higher adherence. On the other hand, it is judged that Sample #4, wherein an Au film was formed on the AuGeNi film by evaporation, had poor adherence between the electrode and the compound semiconductor layer and that the anneal treatment caused agglomeration of metals in the electrode. It is also judged that Sample #5, wherein a Ti film was interposed, had a poor adherence because substantially no alloy was formed in the electrode.

From the above results for adherence, it is concluded that the Au film has an excellent adherence with respect to the compound semiconductor layer. It is also concluded that the Au film interposed between the AuGeNi or AuGe film and the compound semiconductor layer improves the adherence therebetween. That is, the excellent adherence between the Au film and the compound semiconductor layer improves the adherence between the electrode and the compound semiconductor layer even in the case of a small thickness of the Au film as low as 30 nm or below.

The next experiments were such that a voltage was applied between the p-side electrode and the n-side electrode in Samples #1 to #5 for measuring injected current vs. applied voltage characteristics. The results are shown in FIG. 8, wherein the applied voltage is plotted on abscissa and the injected current between the p-side electrode and the n-side electrode is plotted on ordinate.

Figure 8:
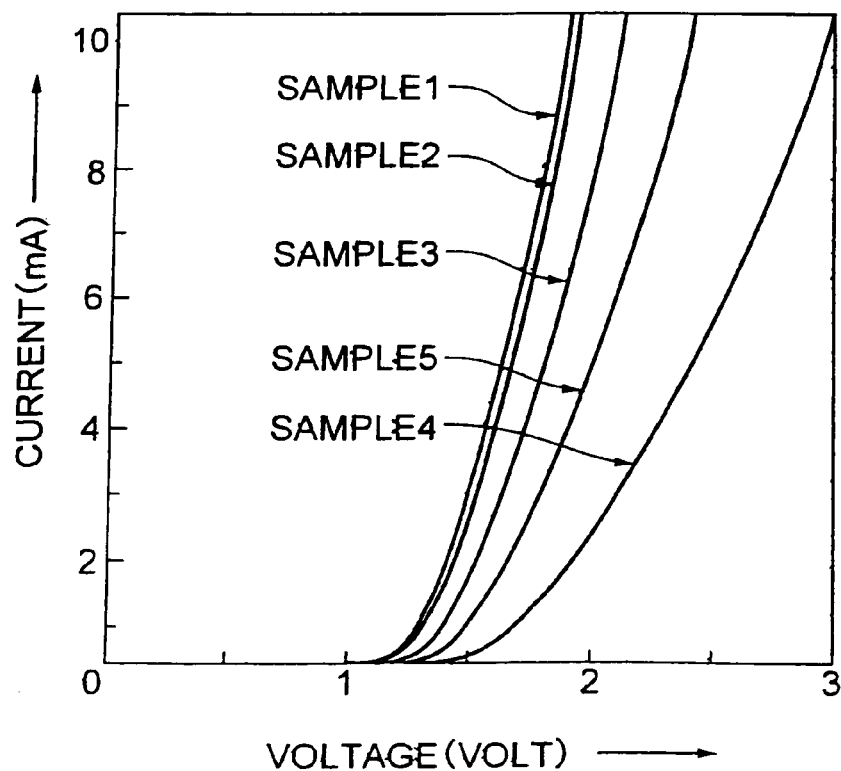
FIG. 8 is a graph for showing an injected current vs. applied voltage characteristic in the semiconductor laser device of the embodiment.

As understood from FIG. 8 by comparing the injected current among Samples #1 to #5, Samples #1 and #2 had larger current compared to Samples #3 to #5. This means that the electric resistance of the n-side electrode is smaller in Samples #1 and #2 having AuGe(Ni)/Au structure in the n-side electrode than in other samples.

Although Sample #3 had an excellent adherence between the n-side electrode and the compound semiconductor layer which is similar to the adherence in Samples #1 and #2, the alloy formed between the compound semiconductor and the metals in the electrode in Sample #3 had a higher electric resistivity compared to the alloy formed by the combination of AuGe(Ni)/Au in Samples #1 and #2.

Sample #4 had a highest resistance among the samples due to the fact that metals in the electrode in Sample #4 were agglomerated by the annealing treatment and an alloy was not substantially formed between the metals and the compound semiconductor layer.

It is known from the prior art that the metals of the electrode in Sample A5 do not form an alloy by an annealing treatment. For achieving a lower resistance electrode in the Ti/Pt/Au structure, it may be considered that the compound semiconductor layer is heavily doped with impurities. However, the improvement in the resistance by the heavy doping is limited compared to the improvement of resistance in the alloy.

From the above results, it is concluded that the Au film interposed between the AuGeNi or AuGe film and the compound semiconductor layer before an annealing treatment achieves a low-resistance electrode while suppressing agglomeration of metals in the electrode during the annealing treatment even in the case of a small thickness for the Au film.

Based on the findings as described above, the surface-emission semiconductor laser device of the present invention has an Au film interposed between the AuGeNi or AuGe film and the compound semiconductor layer.

Now, the present invention is more specifically described with reference to the preferred embodiment thereof.

The method of the preferred embodiment of the present invention is basically same as the method used for fabricating the samples as described above with reference to FIGS. 7A to 7D.

More specifically, in the method of the preferred embodiment of the present invention, 28 combinations of a p-type $Al_{0.2}Ga_{0.8}As$ layer and a p-type $Al_{0.9}Ga_{0.1}As$ layer and an additional p-type $Al_{0.9}Ga_{0.1}As$ layer are epitaxially grown on a p-type GaAs substrate 12 by using a MOCVD technique to form a p-type DBR 14, as shown in FIG. 7A.

Subsequently, an undoped lower $Al_{0.3}Ga_{0.7}As$ cladding layer 16, an active layer structure 18 implemented as a GaAs/$Al_{0.2}Ga_{0.8}As$ multiple quantum well (MQW) structure including three 7-nm-thick GaAs quantum well active layers, and an undoped upper $Al_{0.3}Ga_{0.7}As$ cladding layer 20 are consecutively grown on the p-type DBR 14.

Thereafter, 25 combinations of an n-type $Al_{0.2}Ga_{0.8}As$ layer and an $Al_{0.9}Ga_{0.1}As$ layer are grown on the upper cladding layer 20 to form an n-type DBR 22, followed by epitaxial growth of an n-type cap layer 24 on the top $Al_{0.2}Ga_{0.8}As$ layer of the n-type DBR 22, thereby obtaining the structure shown in FIG. 7A.

A SiNx film 26 is then deposited on the entire area by using a plasma enhanced CVD technique, followed by formation of a photoresist film 28 on the SiNx film 26 and patterning thereof by using an ordinary photolithographic technique to form an etching mask 28. The etching mask 28 has an annular opening which encircles a central circular pattern 30 having a diameter of 30 μm.

The SiNx film 26 is then subjected to a reactive ion etching (RIE) technique by using $CF_4$ gas and the etching mask 28 to form an opening 32 in the SiNx film 26. The resultant structure is shown in FIG. 7B.

The etching mask 28 is then removed, followed by wet etching of the n-type cap layer 24, n-type DBR 22, upper cladding layer 20, active layer structure 18 and lower cladding layer 16 by using the SiNx film as an etching mask and an etchant including a mixture of phosphoric acid, hydrogen peroxide and water. Thus, an annular portion of the p-type DBR 14 is exposed, and a column structure including the n-type cap layer 24, n-type DBR 22, upper cladding layer 20, active layer structure 18 and lower cladding layer 16 is formed on the central area of the p-type DBR 14.

After removing the SiNx film 26 by using a RIE technique, another SiNx film 34 is deposited on the entire area. Then, a portion of the top of the another SiNx film 34 covering the column structure is removed by using a photolithographic technique and a RIE technique to form an emission window 36 having a diameter of 10 μm. Subsequently, a 40-nm-thick Au film, a 50-nm-thick AuGeNi film and a 200-nm-thick Au film are consecutively deposited on the entire surface by electron beam evaporation, followed by patterning thereof to form a n-side electrode 38 having an emission window 36 and an annular area for current injection.

After the bottom of the GaAs substrate 12 is polished to obtain a thickness of 100 μm for the GaAs substrate 12, a p-side electrode 40 made of AuZn film is formed on the polished bottom surface of the GaAs substrate 12 by evaporation. A surface-emission semiconductor laser device 10 is achieved after an alloying treatment of the n-side electrode 38 and the p-side electrode 40.

In the above embodiment, the n-side electrode and the p-side electrode 40 are subjected to the annealing treatment for three minutes at temperature of 420° C. in a nitrogen ambient for alloying the metals in the electrodes. The AuGeNi film in the n-side electrode 38 includes a small amount of Ni which is below 1%, Ge at about 12% and the balance of Au at about 88%.

The n-side electrode 38 may be formed of, for example, a 30-nm-thick Au film, a 50-nm-thick AuGe film and a 200-nm-thick Au film instead of the structure as described above. In this case, the AuGe film preferably includes Au at about 88% and Ge at about 12%.

Since the above embodiments are described only for examples, the present invention is not limited to the above embodiments and various modifications or alterations can be easily made therefrom by those skilled in the art without departing from the scope of the present invention. For example, an additional layer may be interposed between two of layers or at least one of layers may be omitted or modified in the laser device of the embodiment.

Figure 1:
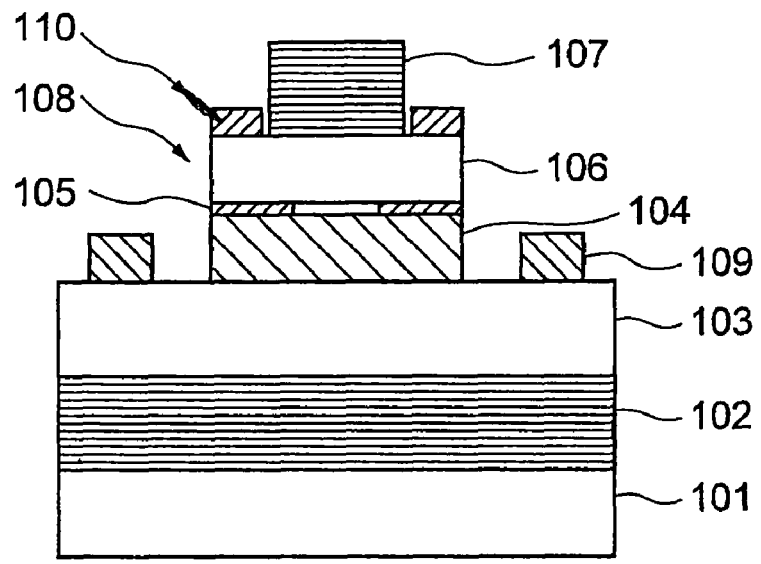
FIG. 1 shows a surface-emitting semiconductor laser device according to an embodiment of the present invention.

FIG. 1 shows a surface-emitting semiconductor laser device according to a first embodiment. The laser device 100A includes: an n-type or semi-insulating substrate 101, and a layer structure including a bottom n-type or undoped multilayer reflector 102, an n-type lower cladding layer 103, an active layer structure 104 for emitting laser, a p-type upper cladding layer 106 and a top multilayer reflector 107 including an undoped semiconductor or dielectric material, which are consecutively formed on the n-type or semi-insulating substrate 101. A portion of the layer structure including the active layer structure 104, the p-type cladding layer 106 and the top multilayer reflector 107 configures a mesa post 108 formed on a portion of the n-type cladding layer 103. The p-type cladding layer 106 or the p-type multilayer reflector 107 includes therein a current confinement oxide layer 105. The top multilayer reflector 107 is formed on a portion of the p-type cladding layer 106. A p-side electrode 110 is formed on another portion of the p-type cladding layer 106 encircling the top multilayer reflector 17. An n-side electrode 109 is formed on another portion of the n-type cladding layer 103 encircling the active layer structure 104. The n-side electrode 109 includes a substantially uniform Au film and an AuGeNi film or AuGe film consecutively formed on the n-type cladding layer 103, and an alloy formed between the Au film and the AuGeNi film or AuGe film.

Figure 2:
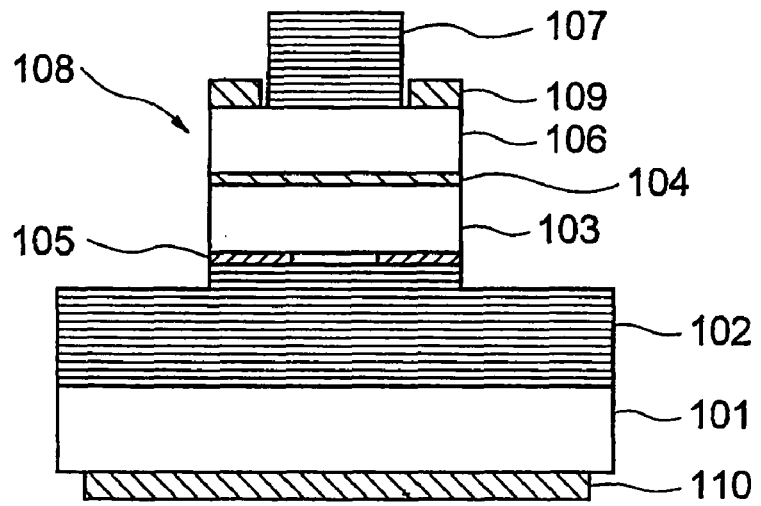
FIG. 2 shows a surface-emitting semiconductor laser device according to an embodiment of the present invention.

FIG. 2 shows a surface-emitting semiconductor laser device according to a second embodiment. The laser device 100B includes a p-type substrate 101, and a layer structure including a p-type bottom multilayer reflector 102, a p-type lower cladding layer 103, an active layer structure 104 for emitting laser, an n-type upper cladding layer 106, and a top multilayer reflector 107 including a dielectric material or semi-insulating material or undoped semiconductor, which are consecutively formed on the p-type substrate 101.

A portion of the layer structure including the p-type cladding layer 103, the active layer structure 104, the n-type cladding layer 106 and the top multilayer reflector 107 configures a mesa post 108 formed on a potion of the p-type bottom multilayer reflector 102. The p-type lower cladding layer 103 includes therein a current confinement oxide layer 105. The top multilayer reflector 107 is formed on a portion of the n-type cladding layer 106. A p-side electrode 10 is formed on the bottom surface of the p-type substrate 101. An n-side electrode 109 is formed on another portion of the n-type cladding layer 106 encircling the top multilayer reflector 107. The n-side electrode 109 includes a substantially uniform Au film and an AuGeNi film or AuGe film consecutively formed on the n-type cladding layer, and an alloy formed between the Au film and the AuGeNi film or AuGe film.

Figure 3:
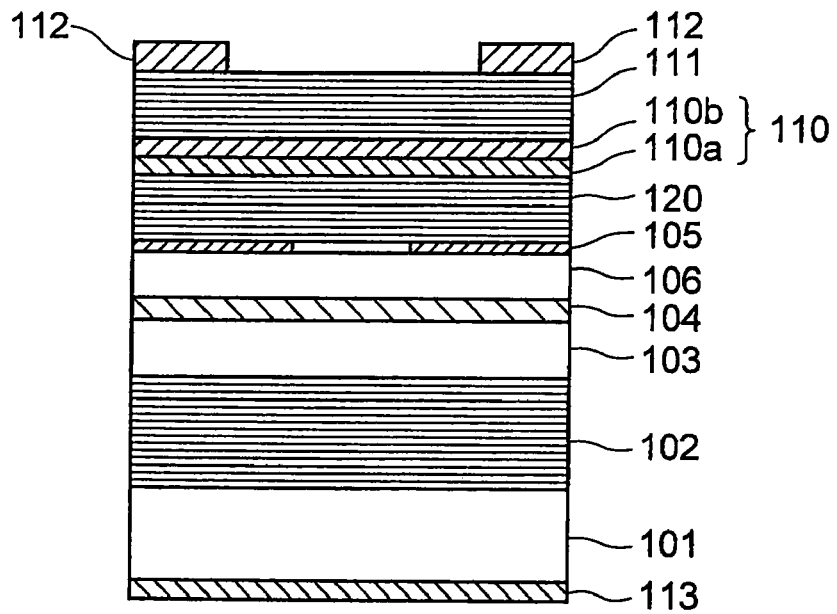
FIG. 3 shows a surface-emitting semiconductor laser device according to an embodiment of the present invention.

FIG. 3 shows a surface-emitting semiconductor laser device according to a third embodiment. The laser device 100C includes: an n-type substrate 101; and a layer structure including an n-type bottom multilayer reflector 102 an n-type lower cladding layer 103, an active layer structure 104 for emitting laser, a p-type upper cladding layer 106 and a p-type multilayer reflector 120, which are consecutively formed on the n-type substrate 101. The p-type cladding layer 106 or the p-type multilayer reflector 120 includes therein a current confinement oxide layer 105.

A tunnel junction structure 110 is formed on the p-type multilayer reflector 120, and includes a heavily-doped p-type layer 110a and an overlying heavily-doped n-type layer 110b. An n-type top multilayer reflector 111 is formed on the tunnel junction structure 110. A first n-side electrode 112 is formed on a portion of the n-type top multilayer reflector 111. A second n-side electrode 113 is formed on the bottom surface of the n-type substrate 101. The first n-side electrode 112 includes a substantially uniform Au film and an AuGeNi film or AuGe film consecutively formed on the n-type top multilayer reflector 111, and an alloy formed between the Au film and the AuGeNi film or AuGe film.

Figure 4:
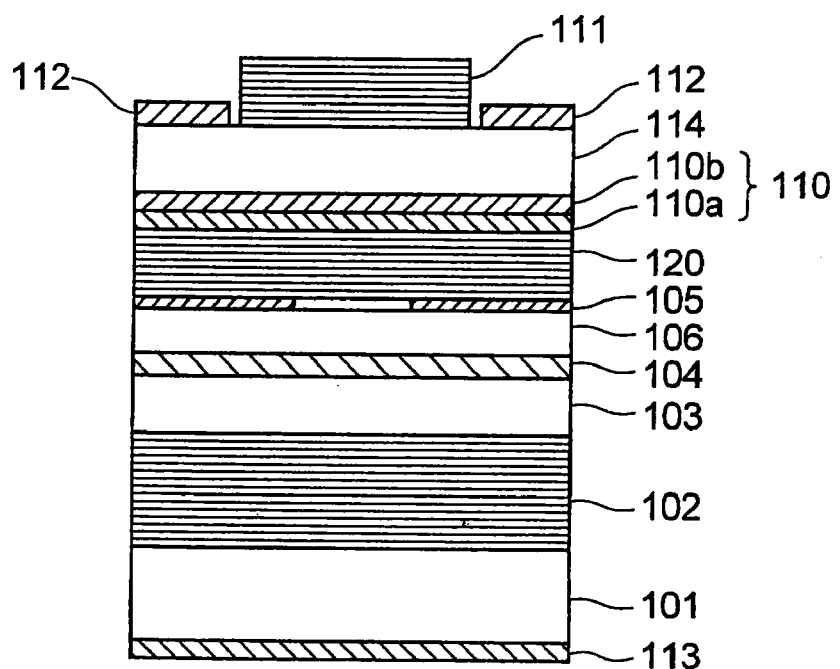
FIG. 4 shows a surface-emitting semiconductor laser device according to an embodiment of the present invention.

FIG. 4 shows a surface-emitting semiconductor laser device according to a fourth embodiment. The laser device 100D includes: an n-type substrate 101; and a layer structure including an n-type bottom multilayer reflector 102, an n-type lower cladding layer 103, an active layer structure 104 for emitting laser, a p-type upper cladding layer 106 and a p-type multilayer reflector 120, which are consecutively formed on the n-type substrate 101. The p-type cladding layer 106 or the p-type multilayer reflector 111 includes therein a current confinement oxide layer 105.

A tunnel junction structure 110 is formed on the p-type multilayer reflector 120 and includes a heavily-doped p-type layer 110a and an overlying heavily-doped n-type layer 110b. An n-type contact layer 114 is formed on the tunnel junction structure 110. A top multilayer reflector 111 including a dielectric material or semi-insulating material or undoped semiconductor is formed on a portion of the n-type contact layer 114. A first n-side electrode 112 is formed on another portion of the n-type contact layer 114 encircling the top multilayer reflector 111. A second n-side electrode 113 is formed on the bottom surface of the n-type substrate 101. The first n-side electrode 112 includes a substantially uniform Au film and an AuGeNi film or AuGe film consecutively formed on the n-type cladding layer, and an alloy formed between the Au film and the AuGeNi film or AuGe film.

Figure 5:
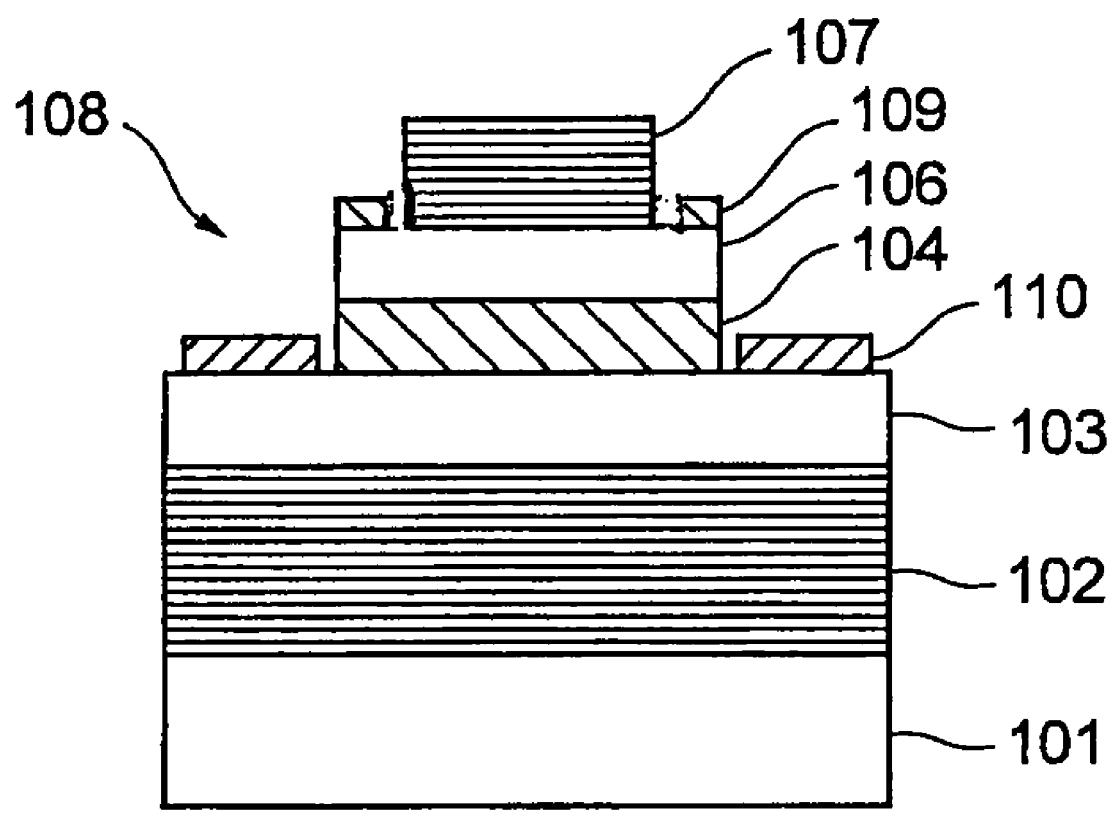
FIG. 5 shows a surface-emitting semiconductor laser device according to an embodiment of the present invention.
Figure 6:
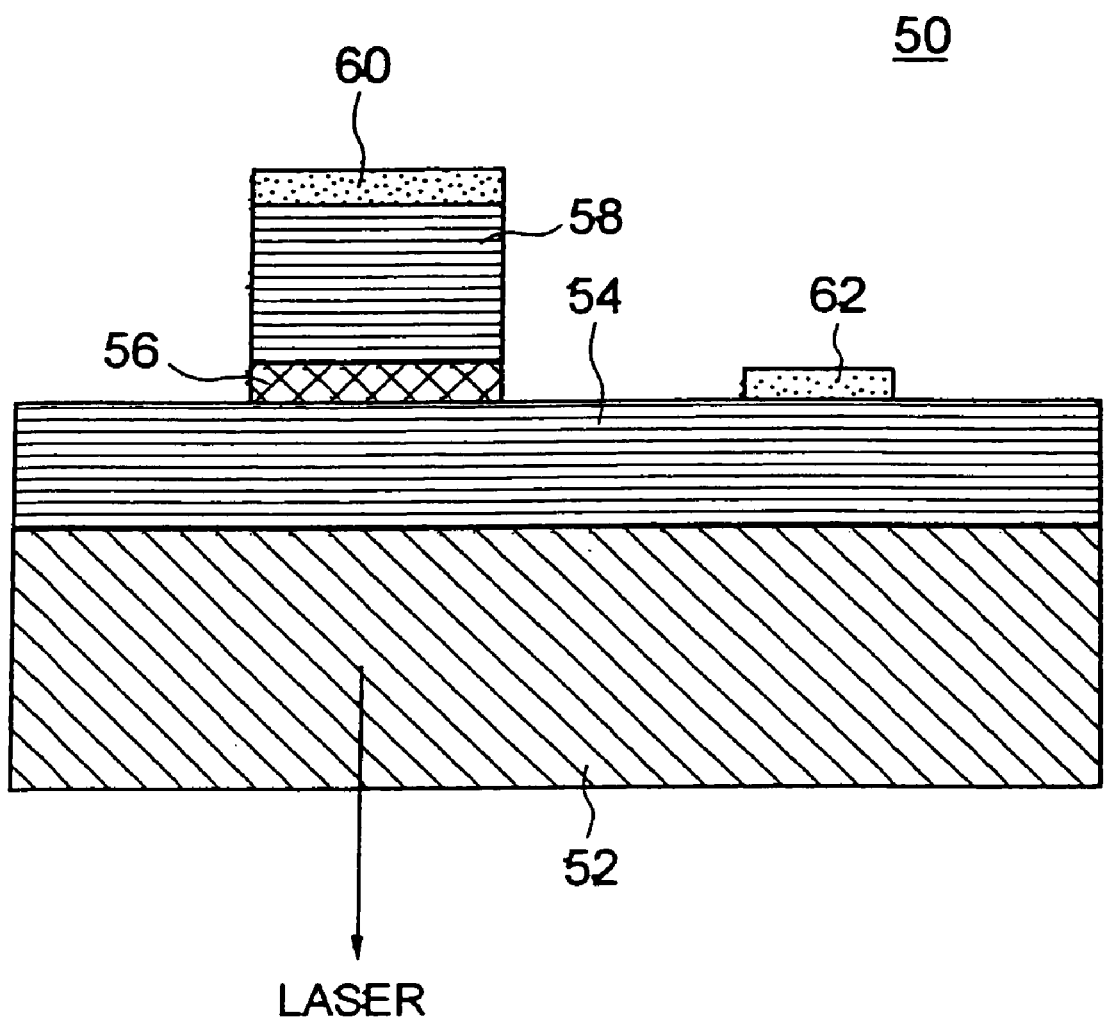
FIG. 6 is a sectional view of a conventional surface-emission semiconductor laser device.

A method for manufacturing a semiconductor device according to a fifth embodiment is directed to forming a surface-emitting laser device shown in FIG. 5. The method of the present embodiment includes the step of consecutively forming, on a semi-insulating substrate 101, a bottom multilayer reflector 102, a p-type lower cladding layer 103, an active layer structure 104 for emitting laser, an n-type upper cladding layer 106, and a top multilayer reflector 107 including a semi-insulating semiconductor or dielectric material. A portion of the layer structure including the top multilayer reflector 107, n-type cladding layer 106 and active layer thus formed is then etched to form a mesa structure 108.

A p-side electrode 110 is then formed on the p-type cladding layer 103. In an alternative, the p-side electrode 110 may be formed on the bottom multilayer reflector 102 after forming the p-type cladding layer 103 in the mesa structure 108. An n-side electrode 109 is then formed on the n-type cladding layer 106. The step of forming the n-side electrode 109 includes forming a substantially uniform Au film on the n-type cladding layer 106, followed by forming an AuGeNi film or AuGe film on the Au film, and lastly forming an alloy formed between the Au film and the AuGeNi film or AuGe film. The n-side electrode 109 may be formed on the top multilayer reflector 107 instead.

In the above embodiment, the step of forming the alloy in the n-side electrode 109 may include annealing the Au film and the AuGeNi film or the AuGe film.

In the above embodiment, the step of forming the n-side electrode 109 may further include forming another Au film on the AuGeNi film or the AuGe film.

Figure 9:
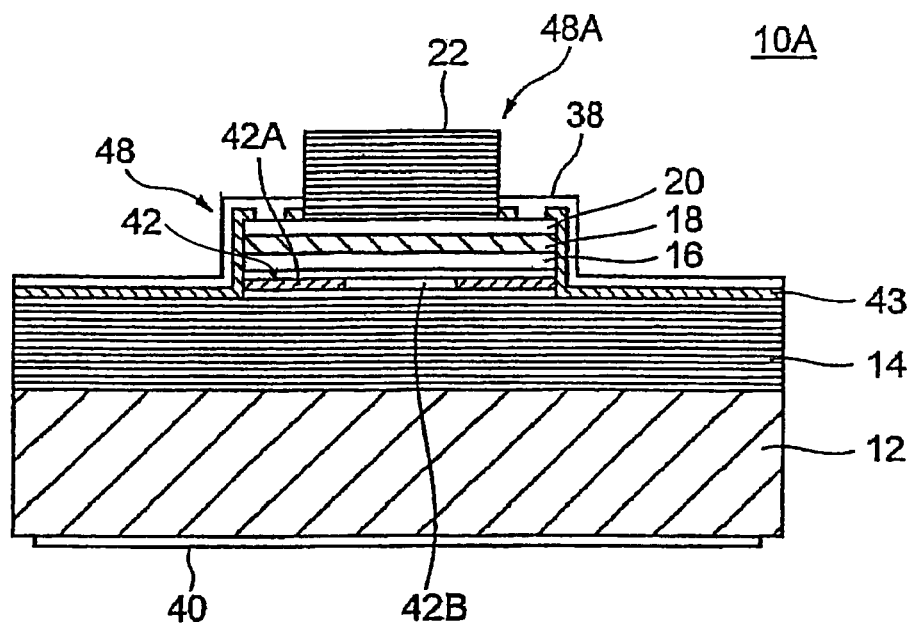
FIG. 9 is a sectional view of the structure of a surface-emission semiconductor laser device according to an example of the present invention.

FIG. 9 is a sectional view of the structure of a surface-emission semiconductor laser device according to a first example of the present invention. The laser device, generally designated by numeral 10A, includes a p-GaAs substrate 12, and a layer structure including a bottom DBR 14, a p-type lower cladding layer 16, a QW active layer structure 18, an n-type upper cladding layer 20 and a top DBR 22, which are consecutively layered on the p-GaAs substrate 12. The bottom DBR 14 includes 35 p-$Al_{0.9}Ga_{0.1}As$/n-$Al_{0.2}Ga_{0.8}As$ layer pairs, wherein each layer has a thickness of $\lambda/4n$, given $\lambda$ and n being the emission wavelength and refractive index, respectively. The top DBR includes 22 i-$Al_{0.9}Ga_{0.1}As$/i-

$Al_{0.2}Ga_{0.8}As$ layer pairs, wherein each layer has a thickness of $\lambda/4n$, given $\lambda$ and n being the emission wavelength and refractive index of each layer. It is to be noted here that the term "i-$Al_{0.9}Ga_{0.1}As$", for example, means a semi-insulating semiconductor $Al_{0.9}Ga_{0.1}As$, which is undoped with impurities.

The bottom DEBRA 14 is such that an $Al_{0.9}Ga_{0.1}As$ layer therein near the QW active layer structure 18 is replaced by an AlAs layer 42, which is subjected to selective oxidation by oxidizing the Al component in the AlAs layer 42 in the peripheral region 42A thereof to leave the central un-oxidized-Al region 42B. The un-oxidized-Al region 42B of the AlAs layer 42 functions as a current injection region, whereas the oxidized-Al region 42A of the AlAs layer 42 functions as a current confinement region.

A portion of the bottom DBR 14 including the oxidized AlAs layer 42, as well as the lower p-type cladding layer 16, QW active layer structure 18 and upper n-type cladding layer 20 among the layer structure is configured as a lower mesa-post 48 having a diameter of 30 μm, for example, by using a photolithographic and etching technique.

The top DEBRA 22 is also configured as an upper mesa-post 48A having a diameter smaller than the diameter of the lower mesa-post 48 as described above. A SiNx layer 43 is formed on top and side of the mesa-post 48 and on the portion of the bottom DEBRA 14 etched during forming the mesa-post 48. The SiNx layer 43 has an opening. An annular n-side electrode 38 is formed on a top portion of the lower mesa-post 48 where the upper mesa-post 48A is not formed, and contacts the n-type cladding layer 20 via the opening of the SiNx layer 43. A p-side electrode 40 is formed on the bottom surface of the p-GaAs substrate 12 after polishing the bottom surface.

The configuration of the first example allows the top DBR 22 to be formed from a material having a higher transmission factor for the laser without requesting an electric conductivity.

Figure 10:
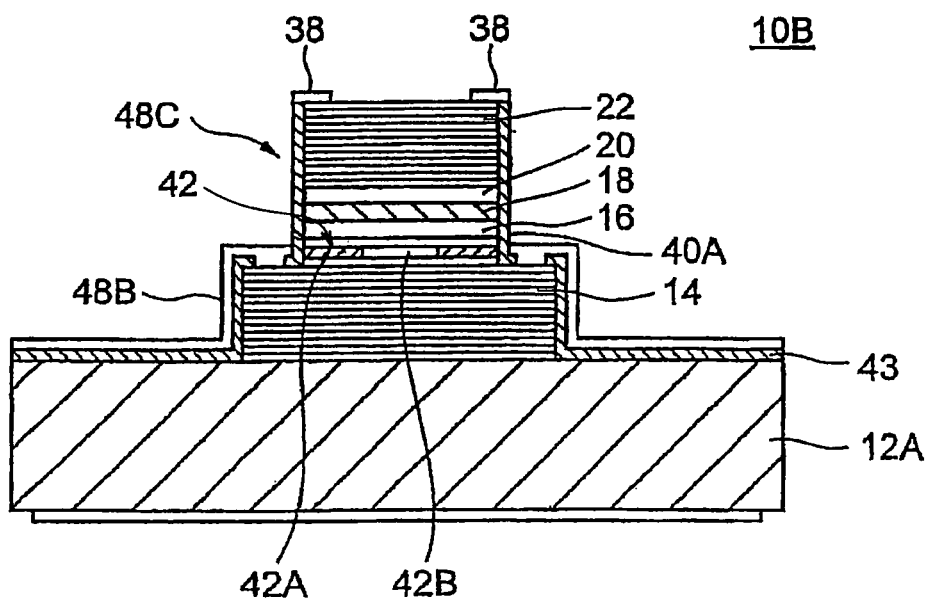
FIG. 10 is a sectional view of a surface-emission semiconductor laser device according to an example of the present invention.

FIG. 10 is a sectional view of a surface-emission semiconductor laser device according to a second example of the present invention. The laser device, generally designated by numeral 10B, includes a substrate 12A, and a layer structure including a bottom DEBRA 14, a p-type lower cladding layer 16, a QW active layer structure 18, an n-type upper cladding layer 20 and a top DEBRA which are consecutively layered on the substrate 12A. The bottom DEBRA 14 includes p-$Al_{0.9}Ga_{0.1}As$/p-$Al_{0.2}Ga_{0.8}As$ layer pairs, wherein each layer has a thickness of $\lambda/4n$, given $\lambda$ and n being the emission wavelength and refractive index, respectively. The top DEBRA 22 includes 25 n-$Al_{0.9}Ga_{0.1}As$/n-$Al_{0.2}Ga_{0.8}As$ layer pairs, wherein each layer has a thickness of $\lambda/4n$, given $\lambda$ and n being the emission wavelength and refractive index, respectively.

In this example, the n-side electrode 38 and p-side electrode 40A are formed to overlie the same main surface of the substrate 12A, whereby the substrate 12A need not have an electric conductivity and thus may be an insulating substrate.

The bottom DEBRA 14 is such that a $Al_{0.9}Ga_{0.1}As$ layer therein near the QW active layer structure 18 is replaced by an AlAs layer 42, which is subjected to selective oxidation by oxidizing the Al component in the AlAs layer 42 in the peripheral region 42A thereof to leave the central un-oxidized-Al region 42B. The un-oxidized-Al region 42B of the AlAs layer 42 functions as a current injection region, whereas the oxidized-Al region 42A of the AlAs layer 42 functions as a current confinement region.

A portion of the bottom DEBRA 14 including the oxidized AlAs layer 42 among the layer structure is configured as a first mesa-post 48B having a diameter of 70 μm, for example, by using a photolithographic and etching technique. Another portion of the bottom DEBRA 14 including the oxidized AlAs layer 42, as well as the lower cladding layer 16, QW active layer structure 18 and upper cladding layer 20 among the layer structure is configured as a second mesa-post 48C having a diameter smaller than the first mesa-post 48B. An annular n-side electrode 38 is formed on top of the top DEBRA 22.

On a portion of the first mesa-post 48B on which the second mesa-post 48C is not formed as well as on the etched portion of the bottom DEBRA 14, a p-side electrode 40A is formed with an intervention of a SiNx layer 43 and contacts the bottom DEBRA 14 via an opening of the SiNx layer 43. It is to be noted that the bottom DEBRA 14 may be made of a semi-insulating material in the region through which the operating current of the laser device does not pass. The semi-insulating material may be a semiconductor undoped with impurities.

It is also noted that the first mesa-post 48B may have a uniform diameter from the oxidized AlAs layer 42 to the lower cladding layer 16, and the p-side electrode 40A is formed on the lower cladding layer 16.

In an alternative of the configuration of the present embodiment, the n-side electrode 38, upper cladding layer 20 and the top DBR 22 may be replaced by p-type semiconductors, and the p-side electrode 40A and bottom cladding layer may be replaced by an n-type semiconductors.

Figure 11:
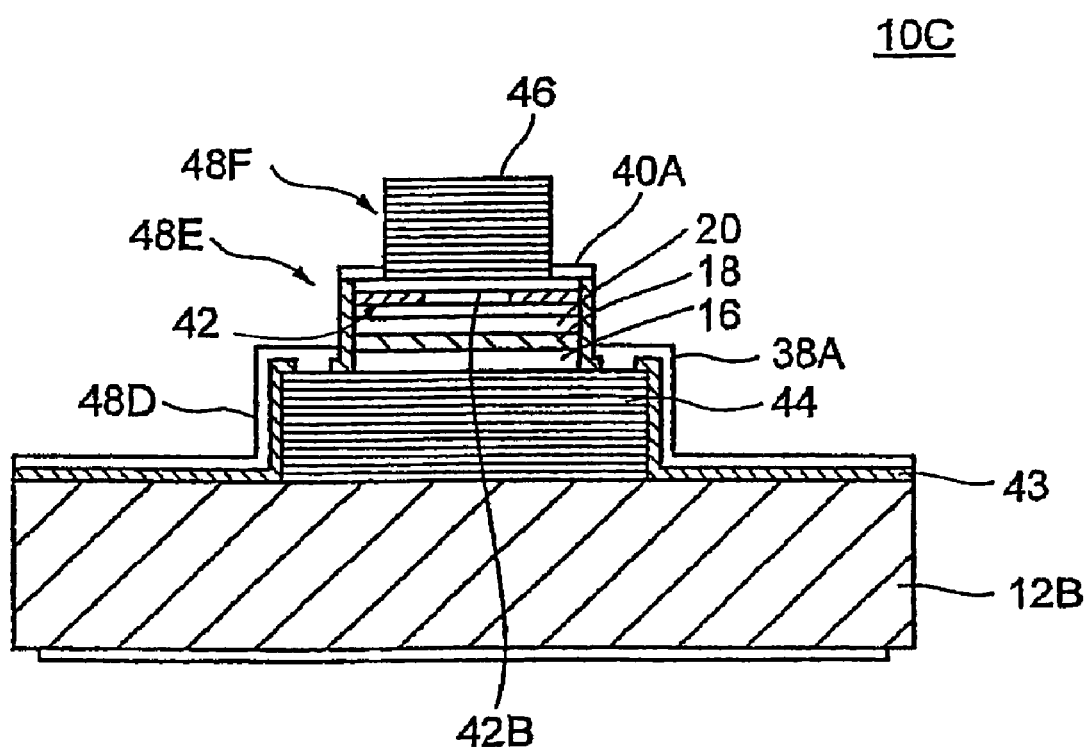
FIG. 11 is a sectional view of a surface-emission semiconductor laser device according to an example of the present invention.

FIG. 11 is a sectional view of a surface-emission semiconductor laser device according to a third example of the present invention. The laser device, generally designated by numeral 10C, includes a substrate 12B, and a layer structure including a bottom DEBRA 44, a p-type lower cladding layer 16, a QW active layer structure 18, an n-type upper cladding layer 20 and a top insulating DEBRA 46 which are consecutively layered on the substrate 12B. The bottom DEBRA 44 includes n-$Al_{0.9}Ga_{0.1}As$/n-$Al_{0.2}Ga_{0.8}As$ layer pairs, wherein each layer has a thickness of $\lambda/4n$, given $\lambda$ and n being the emission wavelength and refractive index, respectively. The top DEBRA 46 includes 25 Si/SiO layer pairs, wherein each layer has a thickness of $\lambda/4n$, given $\lambda$ and n being the emission wavelength and refractive index, respectively.

In this example, the n-side electrode 38A and p-side electrode 40A are formed to overlie the same main surface of the substrate 12B, whereby the substrate 18B need not have an electric conductivity and thus may be an insulating substrate or a conductive substrate.

The bottom DEBRA 44 is such that an $Al_{0.9}Ga_{0.1}As$ layer therein near the QW active layer structure 18 is replaced by an AlAs layer 42, which is subjected to selective oxidation by oxidizing the Al component in the AlAs layer 42 in the peripheral region 42A thereof to leave the central un-oxidized-Al region 42B. The un-oxidized-Al region 42B of the AlAs layer 42 functions as a current injection region, whereas the oxidized-Al region 42A of the AlAs layer 42 functions as a current confinement region.

A portion of the bottom DEBRA 44 among the layer structure is configured as a first mesa-post 48D having a diameter of 70 μm, for example, by using a photolithographic and etching technique. Another portion of the bottom DEBRA 44 including the oxidized AlAs layer 42, as well as the lower cladding layer 16, QW active layer structure 18 and upper cladding layer 20 among the layer structure is configured as a second mesa-post 48E having a diameter smaller than the first mesa-post 48D. The upper DEBRA 46 is configured as a third mesa-post having a diameter smaller the diameter of the second mesa-post 48E. A p-side electrode 40A is formed on a portion of the upper cladding layer 20 of the second mesa-post 48E where the third mesa-post 48F, or top DEBRA 46, is not formed.

An annular n-side electrode 38A is formed on a portion of the bottom DEBRA 44 of the first mesa-post 48D where the second mesa-post 48E is not formed. A portion of the bottom DEBRA 44 which does not configure a current path between the n-side electrode 38A and the p-side electrode 40A may be formed from a semi-insulating semiconductor material undoped with impurities.

In an alternative, the first mesa-post 47D may include the whole bottom DBR 44 including the oxidized AlAs layer 42, and may be formed to have a uniform diameter. In this case, the n-side electrode 38A may be formed on the lower cladding layer 16 to overlie the same.

What is claimed is:

1. A surface-emitting semiconductor laser device comprising:
    an n-type or semi-insulating substrate;
    a layer structure including a bottom multilayer reflector, an n-type cladding layer, an active layer structure for emitting laser, a p-type cladding layer and a p-type top multilayer reflector including a semi-insulating semiconductor or dielectric material, which are consecutively formed on said n-type or semi-insulating substrate, said active layer structure, said p-type cladding layer and said top multilayer reflector configuring a mesa post formed on a portion of said n-type cladding layer, said p-type cladding layer or said p-type top multilayer reflector including therein a current confinement oxide layer, said top multilayer reflector being formed on a portion of said p-type cladding layer;
    a p-side electrode formed on another portion of said p-type cladding layer; and
    an n-side electrode formed on another portion of said n-type cladding layer,
    said n-side electrode including a substantially uniform Au film and an AuGeNi film or AuGe film consecutively formed on said n-type cladding layer, an alloyed layer being formed between said Au film and said AuGeNi film or AuGe film, and said Au film being formed upon said n-type cladding layer.

2. A surface-emitting semiconductor laser device comprising:
    a p-type substrate;
    a layer structure including a p-type bottom multilayer reflector, a p-type cladding layer, an active layer structure for emitting laser, an n-type cladding layer and a top multilayer reflector including a dielectric material or semi-insulating material or undoped semiconductor, which are consecutively formed on said p-type substrate, said p-type cladding layer, said active layer structure, said n-type cladding layer and said top multilayer reflector configuring a mesa post formed on a potion of said p-type bottom multilayer reflector, said p-type cladding layer including therein a current confinement oxide layer, said top multilayer reflector being formed on a portion of said n-type cladding layer;
    a p-side electrode formed on a bottom surface of said p-type substrate; and
    an n-side electrode formed on another portion of said n-type cladding layer,
    said n-side electrode including a substantially uniform Au film and an AuGeNi film or AuGe film consecutively formed on said n-type cladding layer, an alloyed layer being formed between said Au film and said AuGeNi film or AuGe film, and said Au film being formed upon said n-type cladding layer.

3. A surface-emitting semiconductor laser device comprising:
    an n-type substrate;
    a layer structure including an n-type bottom multilayer reflector, an n-type cladding layer, an active layer structure for emitting laser, a p-type cladding layer and a p-type multilayer reflector which are consecutively formed on said n-type substrate, said p-type cladding layer or said p-type multilayer reflector including therein a current confinement oxide layer;
    a tunnel junction structure formed on said p-type multilayer reflector and including a heavily-doped p-type layer and an overlying heavily-doped n-type layer;
    an n-type top multilayer reflector formed on said tunnel junction structure;
    a first n-side electrode formed on at least a portion of said n-type top multilayer reflector; and
    a second n-side electrode formed on a bottom surface of said n-type substrate,
    said first n-side electrode including a substantially uniform Au film and an AuGeNi film or AuGe film consecutively formed on said n-type top multilayer reflector, an alloyed layer being formed between said Au film and said AuGeNi film or AuGe film, and said Au film being formed upon said n-type top multilayer reflector.

4. A surface-emitting semiconductor laser device comprising:
    an n-type substrate;
    a layer structure including an n-type bottom multilayer reflector, an n-type cladding layer, an active layer structure for emitting laser, a p-type cladding layer and a p-type multilayer reflector which are consecutively formed on said n-type substrate, said p-type cladding layer or said p-type multilayer reflector including therein a current confinement oxide layer;
    a tunnel junction structure formed on said p-type multilayer reflector and including a heavily-doped p-type layer and an overlying heavily-doped n-type layer;
    an n-type contact layer formed on said tunnel junction structure;
    a top multilayer reflector including a dielectric material or semi-insulating material or undoped semiconductor and formed on a portion of said n-type contact layer;
    a first n-side electrode formed on another portion of said n-type contact layer; and
    a second n-side electrode formed on a bottom surface of said n-type substrate,
    said first n-side electrode including a substantially uniform Au film and an AuGeNi film or AuGe film consecutively formed on said n-type contact layer, an alloyed layer being formed between said Au film and said AuGeNi film or AuGe film, and said Au film being formed upon said n-type contact layer.

* * * * *